(12) United States Patent
Shiokawa et al.

(10) Patent No.: US 6,531,067 B1
(45) Date of Patent: Mar. 11, 2003

(54) METHOD FOR FORMING CONTACT HOLE

(75) Inventors: Nagamasa Shiokawa, Nobeoka (JP); Atsushi Yamamoto, Nobeoka (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 0 days.

(21) Appl. No.: 09/623,026

(22) PCT Filed: Dec. 28, 1999

(86) PCT No.: PCT/JP99/07401
§ 371 (c)(1),
(2), (4) Date: Aug. 25, 2000

(87) PCT Pub. No.: WO00/39845
PCT Pub. Date: Jul. 6, 2000

(30) Foreign Application Priority Data

Dec. 28, 1998 (JP) ............................. 10-373012

(51) Int. Cl.⁷ .............................................. H01B 13/00
(52) U.S. Cl. ............................. 216/17; 216/18; 216/37; 216/39; 216/67; 216/80; 438/695; 438/696; 438/700; 438/702; 438/703; 438/723; 438/724; 438/734; 438/743
(58) Field of Search .............................. 216/17, 18, 37, 216/39, 67, 80; 438/695, 696, 700, 702, 703, 723, 724, 734, 743

(56) References Cited

U.S. PATENT DOCUMENTS

| | | | |
|---|---|---|---|
| 5,176,790 A | * | 1/1993 | Arleo et al. ............... 252/79.1 |
| 5,254,213 A | | 10/1993 | Tamaki |
| 5,284,549 A | * | 2/1994 | Barnes et al. .................. 216/67 |
| 5,801,101 A | * | 9/1998 | Miyoshi ....................... 216/17 |
| 5,882,489 A | * | 3/1999 | Bersin et al. .......... 204/192.35 |
| 6,117,786 A | * | 9/2000 | Khajehnouri et al. ......... 216/17 |
| 6,124,212 A | * | 9/2000 | Fan et al. .................... 438/709 |
| 6,255,226 B1 | * | 9/2001 | Zheng et al. ............... 438/697 |
| 6,297,163 B1 | * | 10/2001 | Zhu et al. ................... 438/707 |

FOREIGN PATENT DOCUMENTS

| | | |
|---|---|---|
| JP | 03-204928 | 9/1991 |
| JP | 04-23322 | 1/1992 |
| JP | 08-288255 | 11/1996 |

* cited by examiner

Primary Examiner—Randy Gulakowski
Assistant Examiner—M. Kornakov
(74) Attorney, Agent, or Firm—Finnegan, Henderson, Farabow, Garrett & Dunner, L.L.P.

(57) ABSTRACT

The subject of the present invention is to keep the wiring resistance low and reduce the variation of the wiring resistance in one identical lot in semiconductor devices of a multi level interconnect structure in which at least the lower wiring layer is an aluminum wiring layer.

Contact holes (31, 51) are formed in dielectric interlayers (3, 5) of upper and lower wiring layers (1, 2, 4) by dry etching. In the method of forming the contact holes of the invention, the dry etching was applied in two steps divisionally. The first step of etching is applied with supplying $CF_4$, $CHF_3$, Ar and $N_2$ into an etching chamber. The second step of etching is conducted with supplying $CF_4$, $CHF_3$ and Ar into the etching gas chamber.

3 Claims, 2 Drawing Sheets

METHOD FOR FORMING CONTACT HOLE

TECHNICAL FIELD

The present invention concerns formation of contact holes conducted as a step in the production of semiconductor devices.

BACKGROUND ART

When semiconductor devices of multi level interconnect structures are manufactured, contact holes are formed in dielectric interlayers so as to connect upper and lower wiring layers to each other. A step of forming contact holes has been conducted, for example, as described below.

At first, a silicon oxide film is formed as an insulating film on an underlying aluminum wiring layer. Then, a resist film is formed on the silicon oxide film. A mask pattern for contact holes is transferred to the resist film by a photolithographic technique to form a resist pattern. Then, dry etching is applied to the silicon oxide film through the resist pattern.

As an etching gas for the dry etching, a gas mixture of $CF_4$ and $CHF_3$ is used, for instance. Further, in addition to the etching gas, an Ar gas and an $N_2$ gas are supplied in the chamber during etching with the following purpose. The Ar gas is added for the dilution of the etching gas ($CF_4+CHF_3$).

Nitrogen is added mainly for two purposes. One of them is to prevent retrogradation of the resist (scraping of the contact hole edge of the resist pattern) during etching. The other of them is to suppress formation of a polymer, which increases the wiring resistance, on the side wall of the contact holes during etching, and making it readily removable by an organic cleaning liquid or the like even when the polymer is formed.

After thus forming the contact holes, a conductor connecting the upper and the lower wiring layers is deposited into the contact holes (for example, tungsten plugs are formed) and an upper aluminum wiring layer is formed.

However, the semiconductor device of the multi level interconnect structure obtained in the prior art described above involves a problem that the wiring resistance tends to be increased and the wiring resistant is varied in one identical lot.

The present invention has been accomplished taking notice on such a problem in the prior art and it is a subject thereof to make the wiring resistance lower and reduce the variation of the wiring resistance in one identical lot in a semiconductor device of a multi level interconnect structure which at least the under wiring layer comprises an aluminum wiring layer.

DISCLOSURE OF THE INVENTION

For solving the foregoing subject, the present invention provides a method of forming contact holes which comprises forming an insulating film on an aluminum wiring layer and applying dry etching to the insulating film by using a predetermined etching gas through a resist pattern, thereby forming contact holes, wherein the method comprises conducting a first etching step of applying etching with addition of nitrogen to an etching gas for a predetermined period of time and then conducting a second etching step of applying etching with no addition of nitrogen to the etching gas.

In the method of the present invention, it is preferred that the processing time of the first etching step is substantially equal with the time in which the minimum thickness portion of the insulating film is entirely etched in the direction of the thickness.

The etching gas used in the method of the present invention can include a gas containing a fluoro carbon series gas.

The aluminum wiring layer used in the method of the present invention can include an aluminum alloy layer comprising an aluminum alloy containing copper (Cu) and/or silicon (Si).

When etching with addition of nitrogen to the etching gas is applied continuously also after the etching depth has reached the surface of the aluminum wiring layer, AlN is formed to the surface of the aluminum wiring layer as the bottom of a contact hole. On the contrary, it is supposed that such AlN is not formed in the etching conducted with no addition of nitrogen to the etching gas. Then, it is considered that presence of AlN increases the wiring resistance of the resultant semiconductor device of the multi level interconnect structure more in a case of forming the contact hole by the etching method with addition of nitrogen to the etching gas than that in a case of forming the contact hole by the etching method with no addition of nitrogen to the etching gas.

Accordingly, it is preferred that the contact hole is formed by the etching method with no addition of nitrogen to the etching gas in order to lower the wiring resistance. However, this etching method can not provide the effect of preventing the retrogradation of the resist and the effect of suppressing the formation of the polymer to the side wall of the contact hole. As a result, this leads to a problem that the contact hole is formed to a size larger than the predetermined value and the wiring resistance is increased by the effect of the polymer.

On the contrary, in the method according to the present invention, etching with no addition of nitrogen to the etching gas (second etching step) is applied after applying an etching with addition of nitrogen to the etching gas (first etching step) for a predetermined time. Therefore, the effect of preventing the retrogradation of the resist and formation of the polymer described above can be obtained till lapse of a predetermined time from the start of the etching, and the effect of preventing formation of AlN described above can be obtained after lapse of the predetermined time.

Accordingly, if the processing time in the first etching step is properly set depending on the thickness of the insulating film in the upper portion of the aluminum wiring layer, the retrogradation of the resist and the formation of the polymer can be reduced with suppressing the formation of the AlN.

Particularly, if the processing time in the first etching step is made substantially equal with the time in which the minimum thickness portion of the insulating film on the aluminum wiring layer is entirely etched in the direction of the thickness, the first etching step is completed substantially at the time the etching depth for the minimum thickness portion of the insulating film reaches the surface of the aluminum wiring layer. Therefore the formation of AlN can be prevented substantially completely.

As a result, the contact holes can be prevented from being formed larger than the size of the predetermined value, as well as the wiring resistance of the resultant semiconductor device of the multi level interconnect structure can be kept lower and the variation of the wiring resistance in one identical lot can also be reduced.

BEST MODE FOR PRACTICING THE INVENTION

The present invention is to be explained for an embodiment of the present invention.

Figure 1:
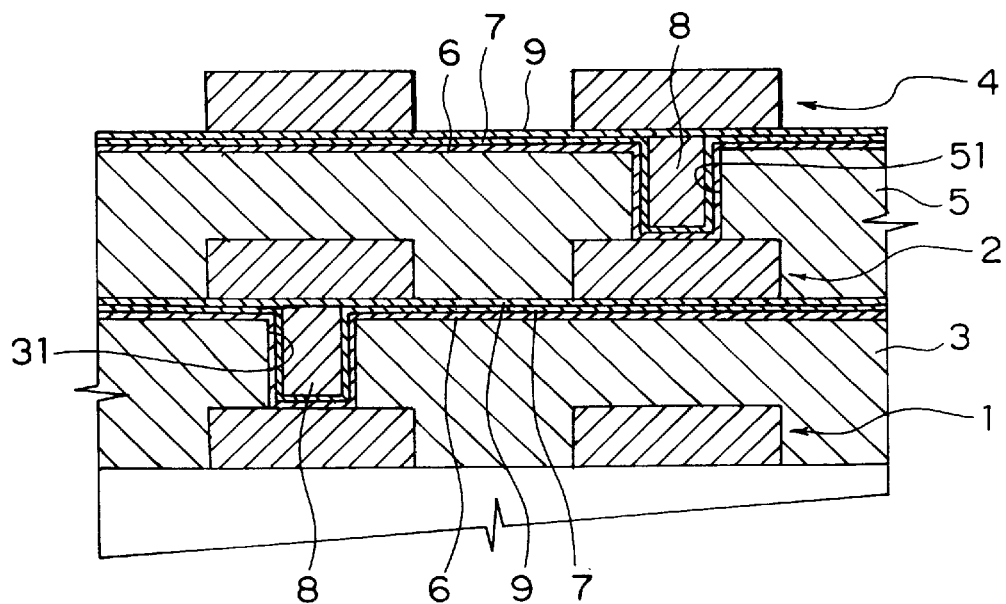
FIG. 1 is a drawing of explaining a method of an embodiment according to the present invention, which is a cross sectional view showing a semiconductor device of a multi level interconnect structure.

An example of applying a method of forming contact holes according to the present invention when a semiconductor device of a wiring structure shown in FIG. 1 is manufactured is to be explained. This semiconductor device is a semiconductor device of a multi level interconnect structure having three aluminum wiring layers.

In this embodiment, dry etching through a resist pattern is applied as described below when a contact hole 31 is formed to an insulating film 3 between a first wiring layer 1 and a second wiring layer 2, and a contact hole 51 is formed to an insulating film 5 between a second wiring layer 2 and a third wiring layer 4.

At first, as a first etching step, plasma etching is applied by supplying also an Ar gas and an $N_2$ gas simultaneously in addition to a $CF_4$ gas and a $CHF_3$ gas supplied as an etching gas into an etching chamber. Then, as a second etching step, plasma etching is applied by supplying only the Ar gas simultaneously in addition to the $CF_4$ gas and the $CHF_3$ gas supplied as the etching gas into the etching chamber.

Other steps than those described above can adopt known methods.

Actually, semiconductor devices having a wiring structure shown in FIG. 1 was manufactured as a TEG (Test Element Group) for measuring wiring resistance. In the semiconductor device, the first wiring layer 1 was connected with the second wiring layer 2 and the second wiring layer 2 was connected with the third wiring layer 4, respectively, by many tungsten plugs 8.

Each of the first to third wiring layers 1, 2 and 4 was formed by applying dry etching to an aluminum alloy film (Si content: 1 wt % and Cu: 0.5 wt %) through a resist pattern. The thickness of the aluminum alloy film was 4000 Å for the first and the second wiring layers 1 and 2 and 7000 Å for the third wiring layer 4.

As the insulating films 3 and 5, a silicon oxide film was formed by a CVD method and the surface was flattened by a CMP method as a mechanical flattening method. Further, the insulating films 3 and 5 are formed such that the thickness was 10,000 to 15,000 Å above the underlying wiring layer. For the insulating films 3 and 5, the silicon oxide film may also be formed so as to make the surface flat by the combined use of a CVD method and a spin-on-glass method.

Contact holes 31 and 51 were formed by applying dry etching to the insulating films 3 and 5 through a resist pattern under the following conditions.

ETCHING CONDITION

Etching apparatus: Plasma etching apparatus "P-5000MxP+" manufactured by Applied Material Japan
Pressure in the chamber: 200 mTorr
Radio frequency power: 700 W
Magnetic field: 30 Gaus
Temperature at the upper portion in the chamber: 40° C.
Temperature at the lower portion in the chamber: 40° C.
Pressure of cooling helium: 14 Torr
Amount of gases supplied into the etching chamber:
  Ar: 100 sccm
  $CF_4$: 30 sccm
  $CHF_3$: 30 sccm
  $N_2$:
    10 sccm in the first etching step
    0 (not supplied) in the second etching step
Processing time in the first etching step: 125 sec (corresponding to a time in which insulative films 3, 5 are etched by 10,000 Å.
Processing time in the second etching step: 165 sec (corresponding to a time in which insulative films 3, 5 are etched by 13,000 Å.

Subsequently, after removing the resist remaining on the insulating films 3 and 5 by a plasma ashing method, the wafer was cleaned with an organic cleaning liquid. Then, a titanium film 6 was formed at a thickness of 300 Å over the entire surface of the wafer including the wall surface and the bottom surface of the contact holes 31 and 51 by a sputtering method. Then, a titanium nitride film 7 was formed at a thickness of 1,000 Å on the titanium film 6.

A tungsten film of 6,000 Å was formed on the titanium nitride film 7 by a CVD method using $WF_6$, $H_2$ and $SiH_4$ as main material gases. Thus, tungsten was deposited by way of the titanium film 6 and the titanium nitride film 7 in the contact holes 31 and 51 and on the insulating films 3 and 5. Subsequently, the tungsten film was etched back by reactive ion etching using $SF_6$ and Ar as main etched gases. Thus, the state tungsten was buried only in the contact holes 31 and 51 was caused, thereby tungsten plugs 8 were formed. Then, a titanium film 9 was formed to a thickness of 200 Å by a sputtering method.

Figure 2:
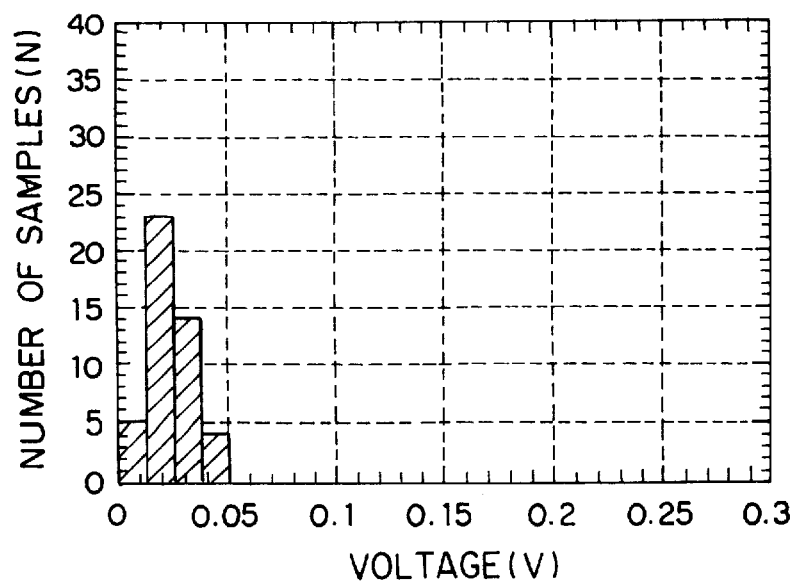
FIG. 2 is a drawing of showing a result of a test for examining wiring resistances to semiconductor devices in which contact holes are formed by a method corresponding to an example of the present invention, which is a graph showing the distribution of voltage measured values in one lot.

For the thus manufactured semiconductor devices, that is, semiconductor devices formed contact holes by the method corresponding to the example of the present invention, the following measurement was conducted. A constant current was supplied to a chain (upper chain) of TEG constituted with the first wiring layer 2 and the third wiring layer 4, and many tungsten plugs 8 connecting them, and a voltage caused to the upper chain was measured. The measurement was conducted to all of the semiconductor devices in one lot. The result is shown by the graph in FIG. 2. Higher measured value for the voltage means higher wiring resistance.

Further, as Comparative Examples 1 and 2 relative to the example described above, semiconductor devices of an identical structure were manufactured quite in the same procedures as described above excepting for changing only the method of forming the contact holes 31 and 51.

In Comparative Example 1, upon etching the insulating films 3 and 5, the contact holes 31 and 51 were formed by supplying a $CF_4$ gas, a $CHF_3$ gas, an Ar gas and an $N_2$ gas in an etching chamber and applying plasma etching for 250 sec. This etching time corresponds to the time in which the insulating films 3 and 5 were etched by 19,000 Å. The amount of the gases supplied into etching chamber was set as shown below.

Ar: 200 sccm $CF_4$: 30 sccm $CHF_3$: 30 sccm $N_2$: 10 sccm

Other etching conditions than described above were identical with those in the example described above.

In Comparative Example 2, upon etching the insulating films 3 and 5, the contact holes 31 and 51 were formed by supplying a $CF_4$ gas, a $CHF_3$ gas and an Ar gas in an etching chamber and applying plasma etching for 290 sec. This etching time corresponds to the time in which the insulating films 3 and 5 were etched by 23,000 Å. The amount of the gases supplied into the etching chamber was set as shown below.

Ar: 200 sccm $CF_4$: 30 sccm $CHF_3$: 30 sccm

Other etching conditions than described above were identical with those in the example described above.

Also for Comparative Examples 1 and 2, a constant current was supplied to the upper chain to measure the voltage for all of the thus manufactured semiconductor devices in one lot. The result is shown by the graph in FIG. 3 for Comparative Example 1 and by the graph in FIG. 4 for Comparative Example 2.

Figure 3:
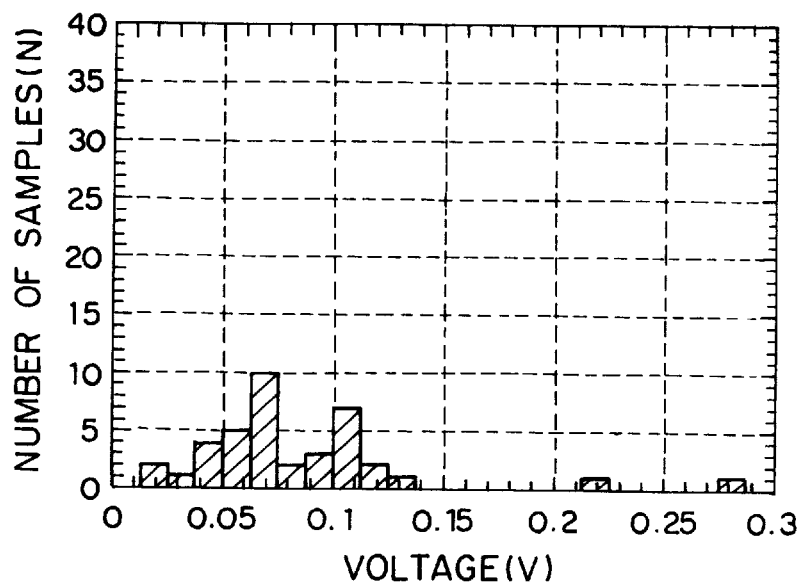
FIG. 3 is a drawing of showing a result of a test for examining wiring resistances of semiconductor device in which contact holes are formed by a method corresponding to a comparative example (Comparative Example 1) of the present invention, which is a graph showing the distribution of voltage measured values in one lot.

As shown in FIG. 3, Comparative Example 1 included those samples showing the voltage measured value of 0.02 to 0.13 V by the number of 1 to 10, and also included those samples showing 0.2 V or more of the value. From the result, it can be seen that great variation is caused to the wiring resistance in one lot in the case where the etching for the formation of the contact holes 31 and 51 was conducted only by the plasma etching method with addition of not only Ar but also $N_2$ to the etching gas ($CF_4$ and $CHF_3$).

Figure 4:
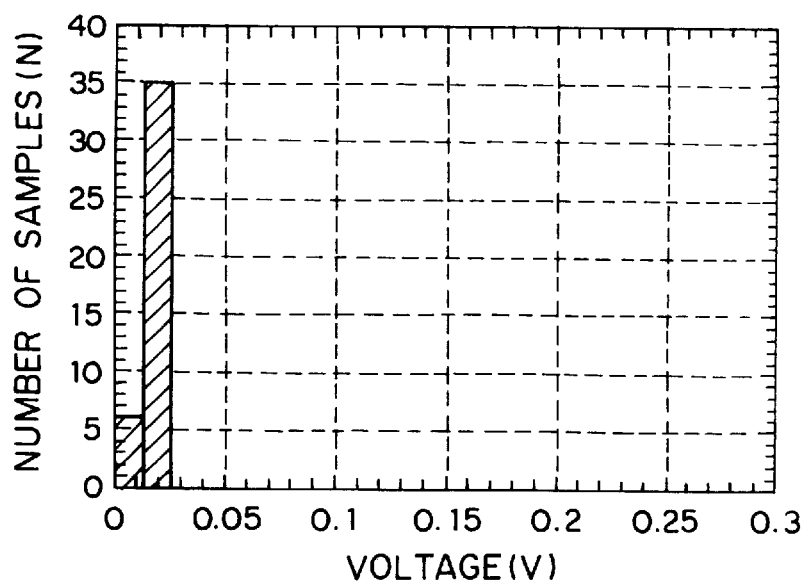
FIG. 4 is a drawing of showing a result of a test for examining wiring resistances of semiconductor devices in which contact holes are formed by a method corresponding to a comparative example (Comparative Example 2) of the present invention, which is a graph showing the distribution of voltage measured values in one lot.

As shown in FIG. 4, in Comparative Example 2, the voltage measured value was 0.025 V or lower for all of the samples and it can be seen that the wiring resistance is lowered and variation of the wiring resistance in one lot is reduced compared with Comparative Example 1. However, when the shape of the contact holes 31 and 51 formed by the method of Comparative Example 2 was examined by SEM (Scanning type Electron Microscope), it has been found that the diameter was formed larger than the predetermined value.

On the contrary, in the example described above, as shown in FIG. 2, the measured voltage value is 0.05 V or lower for all of the samples and it can be seen that the wiring resistance is lowered and the variation of the wiring resistance in one lot is smaller than those of Comparative Example 1. Further, when the shape of the contact holes 31 and 51 formed by the method of the example was examined by SEM (Scanning type Electron Microscope), it has been found that the diameter was formed substantially in accordance with the predetermined value.

As has been described above, in this example, as the etching method for forming the contact holes 31 and 51, at first, plasma etching was conducted while supplying Ar and $N_2$ in addition to the etching gas ($CF_4$ and $CHF_3$) into the etching chamber. The processing time for the etching was determined as a time in which the most thin portion (portion for the thickness of 10,000 Å) of the insulating films 3, 5 above the aluminum wiring layer was etched entirely in the direction of the thickness. Subsequently, plasma etching was applied without supplying $N_2$.

This can prevent the contact holes from being formed larger than the predetermined value, as well as the wiring resistance in the resultant semiconductor devices of the multi level interconnect structure can be kept low and variation of the wiring resistance in one identical lot was also reduced.

INDUSTRIAL APPLICABILITY

As has been described above, according to the method of the present invention, formation of AlN to the bottom of the contact holes can be suppressed, retrogradation of the resistance can be prevented and the formation of the polymer on the side wall of the contact holes can be prevented. As a result, it is possible to keep the wiring resistance of semiconductor devices of the multi level interconnect structure low and reduced the variation of the wiring resistance in one identical lot with preventing the formation of contact holes to a size larger than the predetermined value.

What is claimed is:

1. In a method of forming contact holes by forming an insulating layer on an aluminum layer and etching the insulating layer through a resist pattern using an etching gas, the improvement comprising providing a first etching step, in which the etch gas comprises nitrogen gas and a fluorocarbon gas, whereby suppressing formation of a polymer residue and subsequently providing a second etching step, in which the etch gas comprises fluorocarbon gas and does not contain nitrogen gas, thereby suppressing formation of aluminum nitride residue.

2. The method of forming contact holes of claim 1, wherein a processing time of the first etching step is substantially equal to the time in which the thinnest portion of the insulating layer on the Aluminum layer is substantially etched.

3. The method of forming contact holes of claim 1, wherein the aluminum layer comprises an aluminum alloy containing copper, silcon, or copper and silicon.

\* \* \* \* \*